(12) United States Patent
Yamada et al.

(10) Patent No.: US 8,462,559 B2
(45) Date of Patent: Jun. 11, 2013

(54) MEMORY ERASE METHODS AND DEVICES

(75) Inventors: Shigekazu Yamada, Tokyo (JP);
Tomoharu Tanaka, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/331,185

(22) Filed: Dec. 20, 2011

(65) Prior Publication Data
US 2012/0092933 A1    Apr. 19, 2012

Related U.S. Application Data

(62) Division of application No. 12/477,270, filed on Jun. 3, 2009, now Pat. No. 8,089,816.

(51) Int. Cl.
*G11C 11/34* (2006.01)
(52) U.S. Cl.
USPC .................. 365/185.33; 365/185.24

(58) Field of Classification Search
USPC ........................ 365/185.33, 185.24
See application file for complete search history.

(56) References Cited

U.S. PATENT DOCUMENTS

| | | | |
|---|---|---|---|
| 5,706,241 A | 1/1998 | Nakamura et al. | |
| 7,382,651 B2 | 6/2008 | Nagao et al. | |
| 7,499,325 B2 | 3/2009 | Doyle et al. | |
| 7,547,941 B2 * | 6/2009 | Chen | 257/320 |
| 7,630,244 B2 | 12/2009 | Lee | |
| 2006/0108627 A1 * | 5/2006 | Choi et al. | 257/314 |
| 2007/0257307 A1 | 11/2007 | Chen | |
| 2008/0137409 A1 * | 6/2008 | Nakamura et al. | 365/185.2 |
| 2008/0181020 A1 * | 7/2008 | Yu et al. | 365/185.27 |
| 2008/0239830 A1 | 10/2008 | Lee | |

* cited by examiner

*Primary Examiner* — Michael Tran
(74) *Attorney, Agent, or Firm* — Leffert Jay & Polglaze, P.A.

(57) ABSTRACT

Memory devices and erase methods for memories are disclosed, such as those adapted to discharge an erase voltage from a memory block while protecting low voltage string select gate transistors by maintaining the string select gate transistors in a turned on state during discharge.

21 Claims, 6 Drawing Sheets

MEMORY ERASE METHODS AND DEVICES

RELATED APPLICATION

This is a divisional of U.S. application Ser. No. 12/477,270, titled "MEMORY ERASE METHODS AND DEVICES," filed Jun. 3, 2009 and issued as U.S. Pat. No. 8,089,816 on Jan. 3, 2012, which is commonly assigned and incorporated herein by reference.

FIELD

The present disclosure relates generally to memory devices and in particular the present disclosure relates to memory devices and methods of erasing memories.

BACKGROUND

Memory devices are typically provided as internal storage areas in a computer. The term memory identifies data storage that comes in the form of integrated circuit chips. There are several different types of memory used in modern electronics, one common type is RAM (random-access memory). RAM is characteristically found in use as main memory in a computer environment. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Memory devices that do not lose the data content of their memory cells when power is removed are generally referred to as non-volatile memories. An EEPROM (electrically erasable programmable read-only memory) is a special type non-volatile ROM that can be erased by exposing it to an electrical charge. EEPROM comprise a large number of memory cells having charge storage nodes, such as floating gates or charge traps, for example. Data is stored in the floating gate field effect transistor (FET) memory cells in the form of charge on the charge storage node. One type opf charge storage node, a floating gate, is typically made of doped polysilicon disposed over the channel region and electrically isolated from the other cell elements by a dielectric material, typically an oxide. Charge is transported to or removed from the floating gate or trapping layer by specialized programming and erase operations, respectively, altering the threshold voltage of the device.

Yet another type of non-volatile memory is a Flash memory. A typical Flash memory comprises a memory array, which includes a large number of charge storage node based memory cells. The cells are usually grouped into sections called "erase blocks." Each of the cells within an erase block can be electrically programmed by tunneling charges to its individual charge storage node. Unlike programming operations, however, erase operations in Flash memories typically erase the memory cells in bulk erase operations, wherein all memory cells in a selected erase block are erased in a single operation. It is noted that in recent non-volatile memory devices multiple bits have been stored in a single cell by utilizing multiple threshold levels or a non-conductive charge trapping layer with the storing of data trapped in a charge near each of the sources/drains of the memory cell FET.

A NAND architecture array of a EEPROM or Flash also arranges its array of non-volatile memory cells in a matrix of rows and columns, as a conventional NOR array does, so that the gates of each non-volatile memory cell of the array are coupled by rows to word lines (WLs). However, unlike NOR, each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. It is noted that other non-volatile memory array architectures exist, including, but not limited to AND arrays, OR arrays, and virtual ground arrays.

In modern NAND flash memories, NAND array density is increasing. Array pitch-pattern is getting smaller as each new generation of fabrication processes advances. Because of increasing array density, array-related area uses up a great deal of die space, and can potentially be more than a die package like a thin small online package (TSOP) memory housing.

As a result of advancing process technologies, the defect rate in array-related areas is likely to increase because of very tight data line (such as those data lines typically referred to as bit lines) to data line pitch. For example, bit line decoding in increased-density arrays typically has a high defect rate.

Newer forms of NAND flash compensate for these difficulties by replacing a high voltage transistor for bit line decoding with a lower voltage transistor in order to decode bit line groups, such as even and odd pages. Such lower voltage transistors, often referred to as low voltage transistors (NMOS or PMOS types, for example), are smaller in physical size than, and operate at lower voltages than, larger, higher power transistors. Bit lines are typically charged to near 20 volts during an erase operation. In such erase operations, the low voltage transistor, typically a select-gate n-type metal oxide semiconductor, is also charged to a higher voltage so that it does not break down. Breakdown of such a low voltage transistor can trap a high voltage on the bit lines.

For the reasons stated above, and for other reasons stated below which will become apparent to those skilled in the art upon reading and understanding the present specification, there is a need in the art for erasing memory blocks without low voltage transistor breakdown.

DETAILED DESCRIPTION

Figure 1:
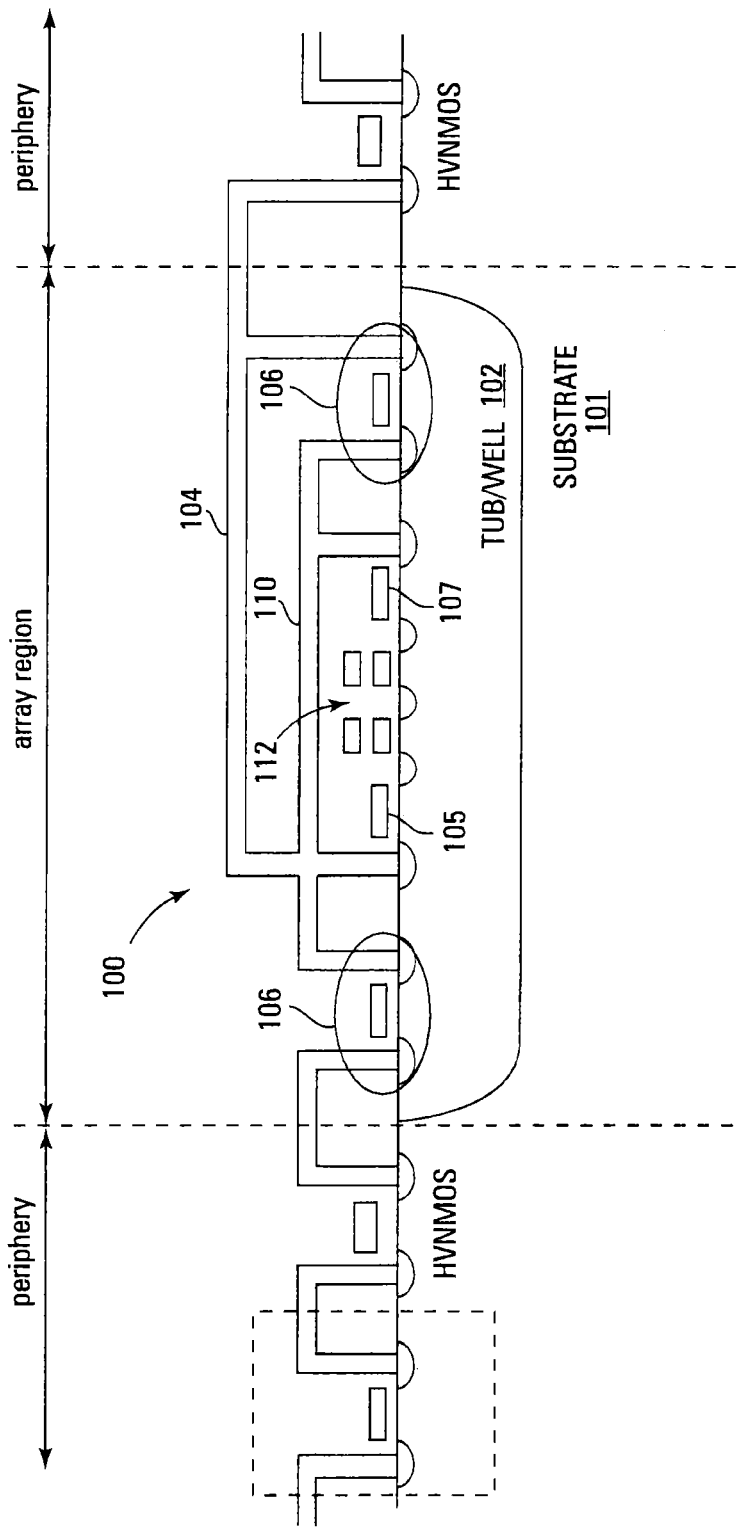
FIG. 1 is a diagram of a partial memory structure according to an embodiment of the present disclosure.

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

A portion of a NAND array 100 is shown in FIG. 1. NAND array 100 comprises in one embodiment a tub (e.g., well) 102 formed in a semiconductor material, such as substrate 101. A source line 104 is connected to the tub through source connections as shown. Source side select gate 105 and drain side select gate 107 control access to NAND strings in the memory. String select gate transistors 106 and 108 are in one embodiment low voltage NMOS transistors (for example a low voltage transistor of the same type of construction as transistors 105 and 107), and are used for controlling erase operations in the memory 100. Data lines (such as those typically referred to as bit lines) 110 are used in sensing information stored in the memory cells 112 of the array 100 and programming information into the array 112. The cells 112 are arranged in logical rows and columns.

Figure 2:
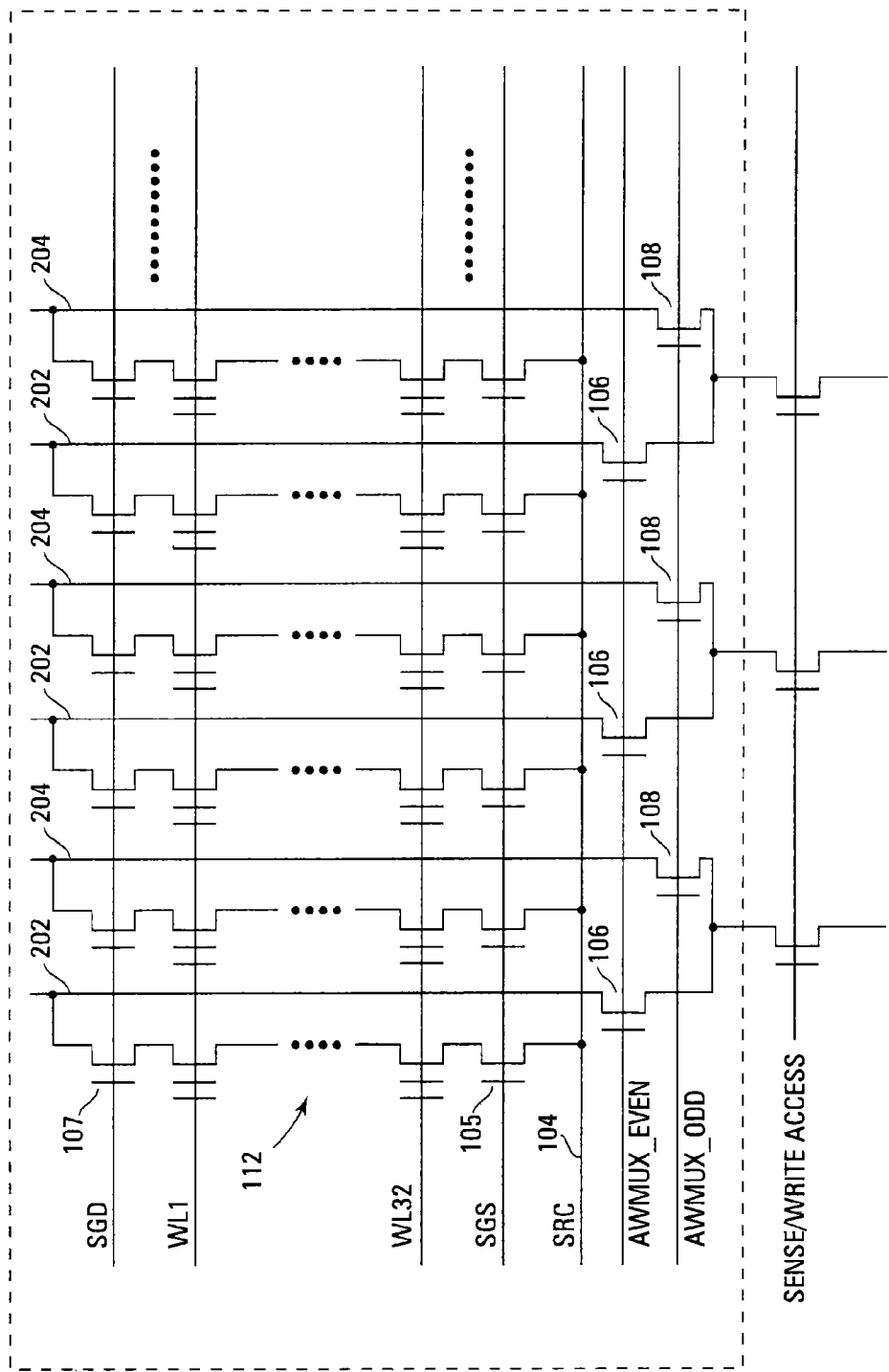
FIG. 2 is a partial circuit diagram of a memory according to another embodiment of the present disclosure.

The portion of the array 100 can be seen in circuit diagram form in FIG. 2. The cells 112 are arranged in NAND strings such as even strings 202 and odd strings 204, even strings 202 accessed by turning on even string select gate transistors 106, and odd strings 204 accessed by turning on odd string select gate transistors 108 using signals AWMUX_EVEN and AWMUX_ODD, respectively. Source side select gate transistors 105 and drain side select gate transistors 107 are controlled by signals SGS and SGD respectively.

In a NAND memory, a block of memory cells is typically erased by grounding all of the word lines in the block and applying an erase voltage to a semiconductor material (e.g., a tub in the semiconductor material) on which the memory cells are formed, and thus to the channels of the memory cells, to remove the charge from the charge storage nodes. More specifically, the charge is usually removed through Fowler-Nordheim tunneling of electrons from the charge storage node to the channel.

The typical erase operation for a NAND memory using low voltage string select gate transistors charges the tub, source, and gates of the string select gate transistors to the erase voltage. The bit lines are charged by a forward bias on the PN junction through the tub. When the erase portion of the erase operation is completed, typically, the tub and source are discharged to a reference voltage Vss (e.g., a substrate voltage, for example ground). The gates of the string select gate transistors are coupled down to Vss by the tub. The bit lines are discharged through break down of the PN junction. For typical bit line discharge, the PN junction breaks down at about 8 volts, which can stress low voltage string select gate transistors which are generally not capable of withstanding such a high voltage stress without break down, reducing their reliability. Voltage as high as the PN junction break down voltage could be trapped on the bit lines for a long period of time, leading to further unreliability of the low voltage string select gate transistors.

Figure 3:
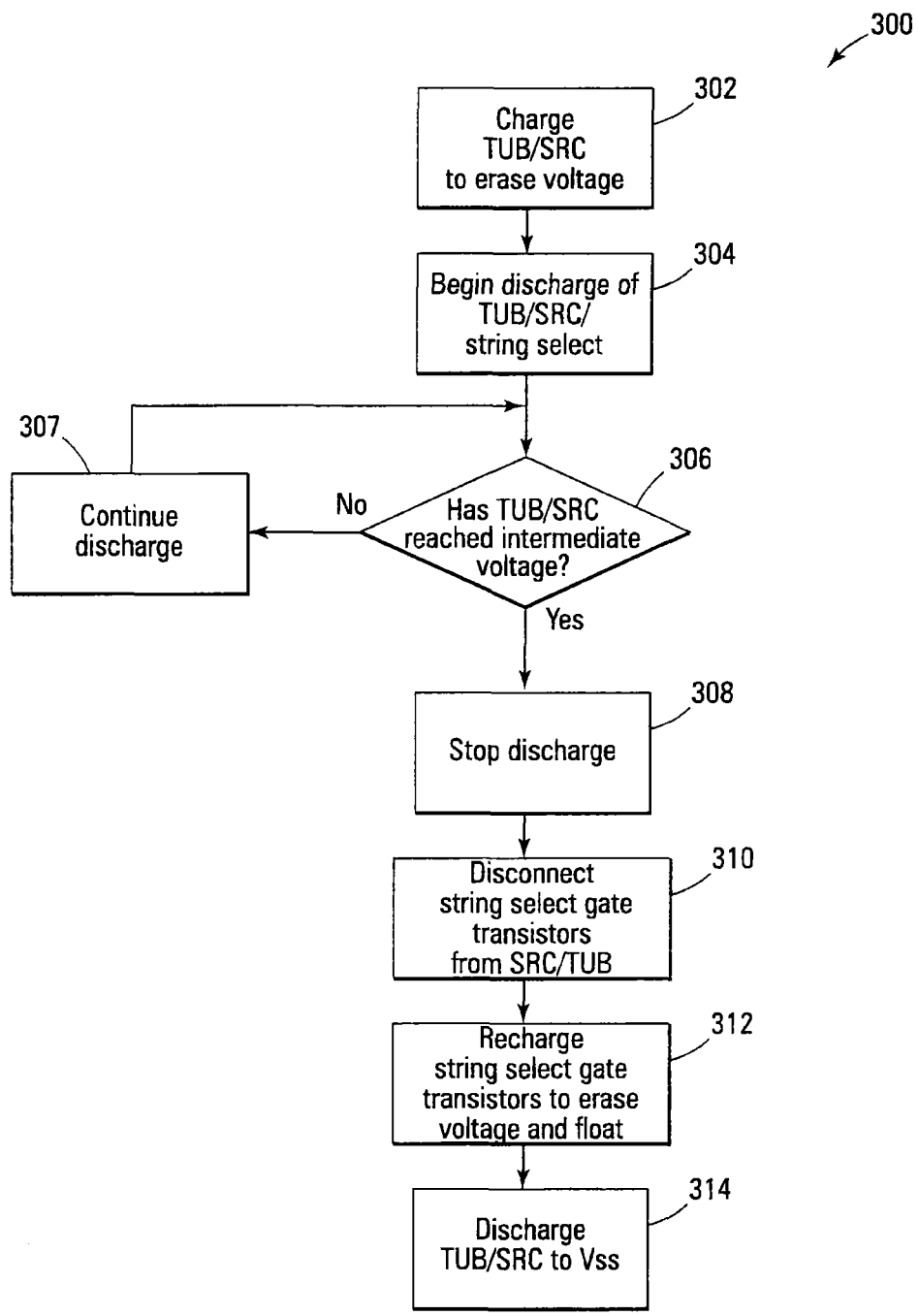
FIG. 3 is a flow chart diagram of a method according to another embodiment of the present disclosure.

In operation, an erase operation according to an embodiment of the present disclosure is shown in flowchart form in FIG. 3. In block 302, the tub and source lines of a block to be erased are charged to an erase voltage (in one embodiment approximately 20 volts). The gates of the string select gate transistors are also charged to the erase voltage. The bit lines are charged in one embodiment to the erase voltage by a PN gate forward biasing through the tub voltage. The erase voltage erases the memory cells in the block to be erased. When the erase portion is complete, the erase operation continues with discharging the tub and source lines, as well as the gates of the string select gate transistors in block 304. This discharge is to an intermediate voltage below the erase voltage (in one embodiment approximately 16 volts, lower that the erase voltage by at least a turn-on voltage of the string select gate transistors). In block 306, a determination is made as to the level of discharge of the tub voltage and/or source line. For example, if the tub voltage has not reached the intermediate voltage, discharge continues at block 307, and tub voltage is monitored at block 306. When tub voltage reaches the intermediate voltage, the discharge is stopped at block 308, such as by floating the source line and/or tub. The gates of the string select gate transistors are disconnected from the tub and source lines in block 310, and their gates are recharged to the erase voltage in block 312. This action turns the string select gate transistors on.

Once the string select gate transistors are turned on, the bit lines 110 are discharged to the tub/source voltage, and discharging of the tub and source line is restarted in block 314, such as by connecting the tub and source line to a reference voltage, such as Vss (e.g., ground). The gates of the string select gate transistors are left floating, and are discharged by coupling effects to the tub and source line. The bit lines 110 are discharged through break down of the PN junction between the bit lines and the tub. The string select gate transistors remain on throughout the discharge portion of the erase operation, since they remain at a voltage no lower than approximately the difference between the erase voltage and the intermediate voltage (in one embodiment about 4 volts). Thus, no high voltage is left on the bit lines, and the string select gate transistors are protected from breakdown.

In one embodiment, the tub and/or the source voltage is compared in a comparator with the intermediate voltage. The comparator signal changes when the tub and/or source voltage reaches the intermediate voltage, and stops the discharge. It should be understood that there are numerous methods and circuits to stop the discharge of the tub and/or source at the intermediate voltage, and that those numerous methods and circuits, being within the skills of those in the art, are amenable to use with and are within the scope of the various embodiments of the present disclosure.

Figure 4:
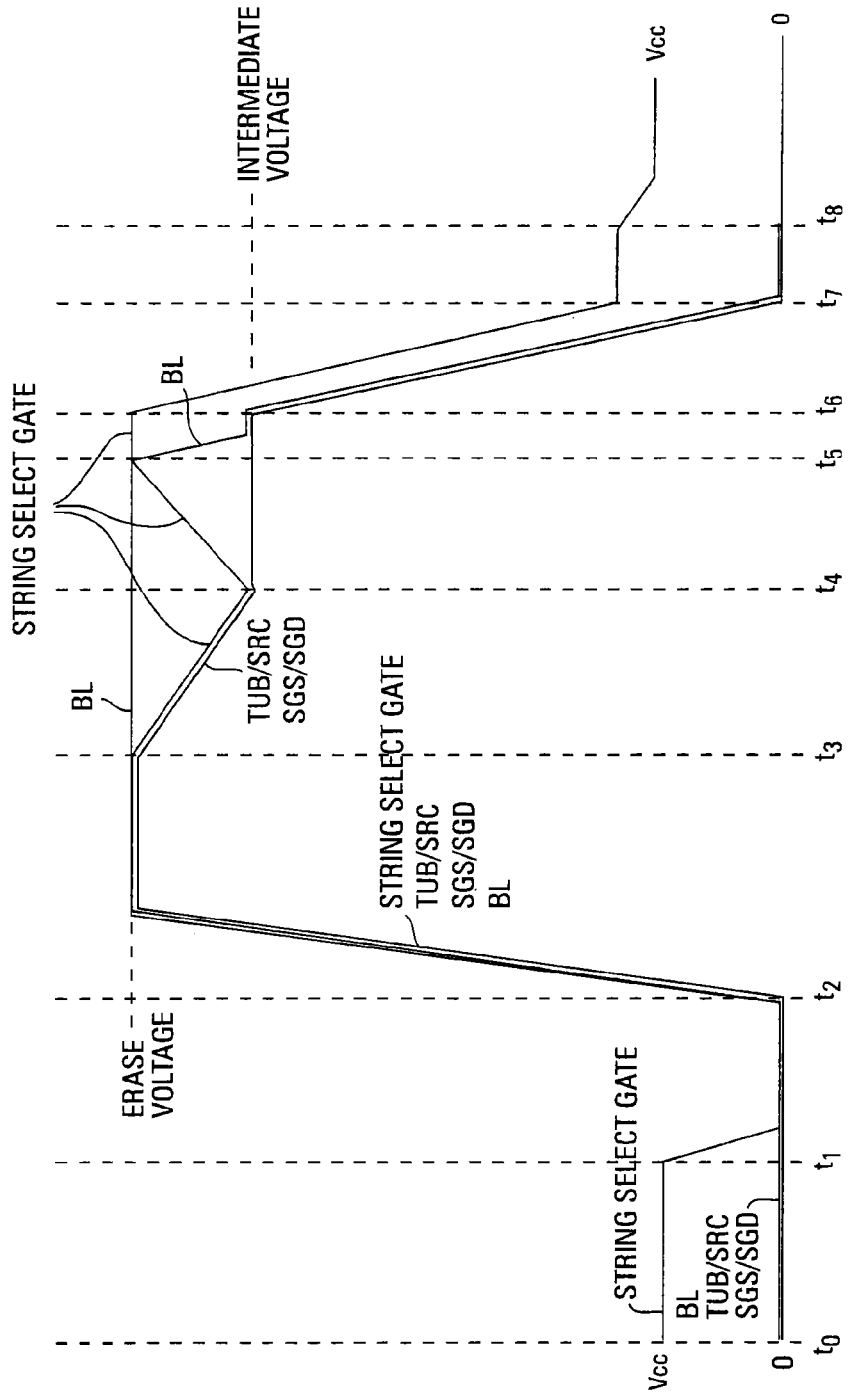
FIG. 4 is a timing diagram of a method according to another embodiment of the present disclosure.

A timing diagram for an erase operation is shown in FIG. 4, with reference numerals corresponding to the diagrams of FIGS. 1 and 2. The voltages for each of the tub/source 102/104, gates of the string select gate transistors 106/108, bit lines 110, and source 105 and drain 107 select gate signals are shown throughout the erase operation in FIG. 4. At time t0, the beginning of an erase operation, the tub 102 and source 104, as well as the bit lines 110, are at a reference voltage (Vss). The gates of the low voltage string select gate transistors 106 and 108 are at a supply voltage (Vcc) At time t1, the gates of transistors 106 and 108 are discharged to Vss. At time t2, the transistors 106 and 108 are connected to tub/source 102/104, and tub/source 102/104 is charged to the erase voltage, thereby coupling transistors 106 and 108 up to the erase voltage. Each of the tub/source 102/104, the gates of source 105 and drain 107 select gates, and the gates of string select gate transistors 106 and 108 charge to the erase voltage. The bit lines are coupled up to the erase voltage through forward biasing of the PN junction between the bit lines 110 and the tub 102.

At time t3, the tub/source 102/104 is disconnected from the erase voltage and is connected to Vss. The tub/source 102/104, gates of drain 105 and source 107 select gates, and the gates of transistors 106 and 108 begin to discharge toward Vss. At time t4, the voltages of tub/source 102/104, gates of drain 105 and source 107 select gates, and the gates of transistors 106 and 108 reach an intermediate voltage, and the source/tub 102/104 is disconnected from Vss. The gates of transistors 106 and 108 are disconnected from tub/source 102/104, and are charged to the erase voltage. They charge back to the erase voltage by time t5, when transistors 106 and 108 turn on, discharging the bit lines 110 to the intermediate voltage by time t6.

At time t6, with transistors 106 and 108 on, they are disconnected from the erase voltage and allowed to float. Also, tub/source 102/104 is connected to Vss, and bit lines 110, the gates of source 105 and drain 107 select gates, and tub/source 102/104 begin to discharge to Vss from the intermediate voltage. The gates of transistors 106 and 108 begin to discharge at the same rate by coupling down with tub/source 102/104. Transistors 106 and 108 remain on with the voltage difference between them and tub/source 102/104. At time t7, tub/source 102/104, gates of drain 105 and source 107 select gates, and bit lines 110 are discharged to Vss, and gates of transistors 106 and 108 have discharged through coupling down to a difference between the erase voltage and the intermediate voltage (in one embodiment approximately 4 volts).

The difference between the intermediate voltage and the erase voltage is chosen in one embodiment to ensure that transistors 106 and 108 remain on for the entire discharge portion of the erase operation, such as to avoid breakdown due to high voltage stress. The bit lines 110 are properly discharged to Vss without the transistors 106 and 108 breaking down. At time t8, when coupling down is completed, the gates of transistors 106 and 106 are charged to Vcc. In this embodiment, the select gates remain on for the discharge to Vss portion of the erase operation, and are protected from breakdown by remaining on. Further, since there is no breakdown, and the string select gate transistors 106 and 108 remain on, no voltage is trapped on the bit lines 110, which are properly and fully discharged.

Figure 5:
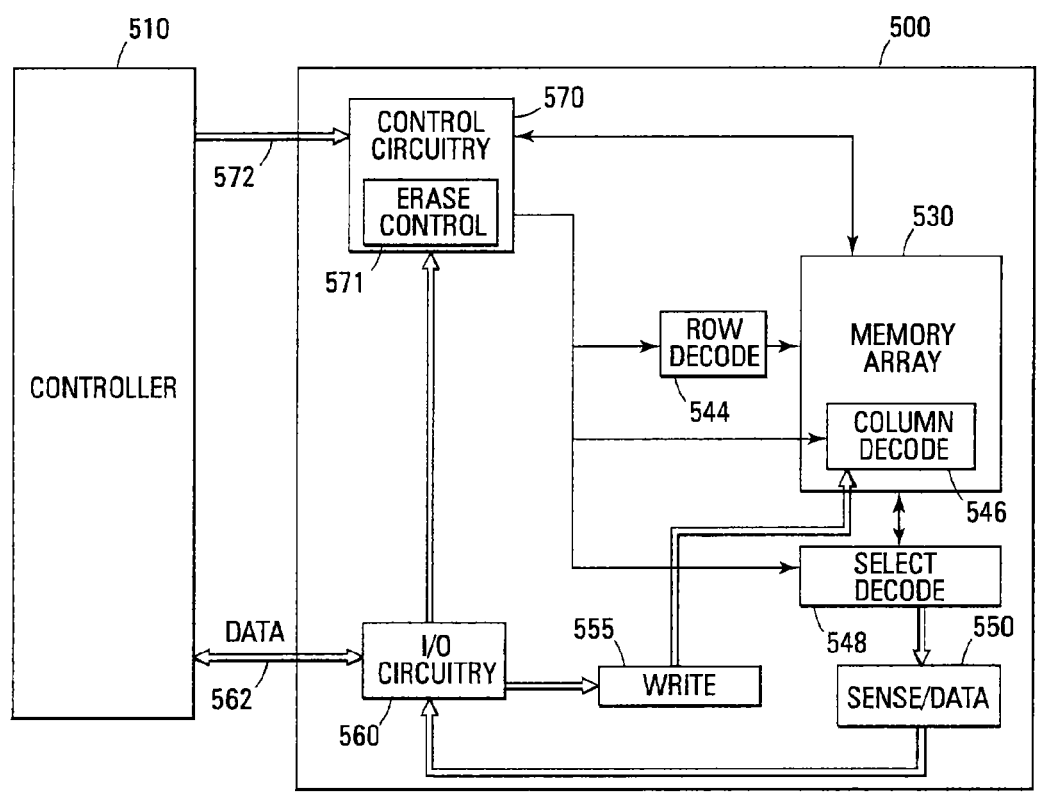
FIG. 5 is a functional block diagram of a system according to an embodiment of the present disclosure.

FIG. 5 illustrates a functional block diagram of a memory system 520 that includes a non-volatile memory device 500. The memory device 500 has been simplified to focus on features of the memory that are helpful in understanding the present programming embodiments. The memory device 500 is coupled to an external controller 510. The controller 510 may be a microprocessor or some other type of control circuitry.

The memory device 500 includes an array 530 of non-volatile memory cells, such as the ones illustrated in FIG. 1 discussed previously. The memory array 530 is arranged in banks of access lines such as word line rows and data lines such as bit line columns. In one embodiment, the columns of the memory array 530 are comprised of series strings of memory cells. As is well known in the art, the connections of the cells to the bit lines determines whether the array is a NAND architecture, an AND architecture, or a NOR architecture.

Address buffer circuitry 540 is provided to latch address signals provided through the I/O circuitry 560. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense amplifier/data cache circuitry 550. The sense amplifier/data cache circuitry 550, in one embodiment, is coupled to read and latch a row of data from the memory array 530. Data input and output buffer circuitry 560 is included for bi-directional data communication as well as address communication over a plurality of data connections 562 with the controller 510. Write circuitry 555 is provided to write data to the memory array.

Memory control circuitry 570 provides address circuitry, and circuitry to decode signals provided on control connections 572 from the processor 510. These signals are used to control the operations on the memory array 530, including data read, data write (program), and erase operations. The memory control circuitry 570 may be a state machine, a sequencer, or some other type of controller to generate the memory control signals. In one embodiment, the memory control circuitry 570 is configured to control the bit line charging of the programming embodiments discussed previously.

The memory control circuitry 570 also includes in one embodiment an erase control circuit 571 (shown in greater detail in FIG. 6) that controls the erase operation of the system 520. The erase control circuit is configured to perform the erase operations described herein, including providing proper voltages to the array and its components, such as the voltages applied to select decode circuitry 548 to control the string select gate transistors 106 and 108 for odd and even page operations, and for control of erase operations according to one or more of the various methods described herein with respect to at least FIGS. 3 and 4.

It should be understood that many circuits are amenable to perform such control, and that the choice and configuration of those circuits is within the scope of the disclosure.

Figure 6:
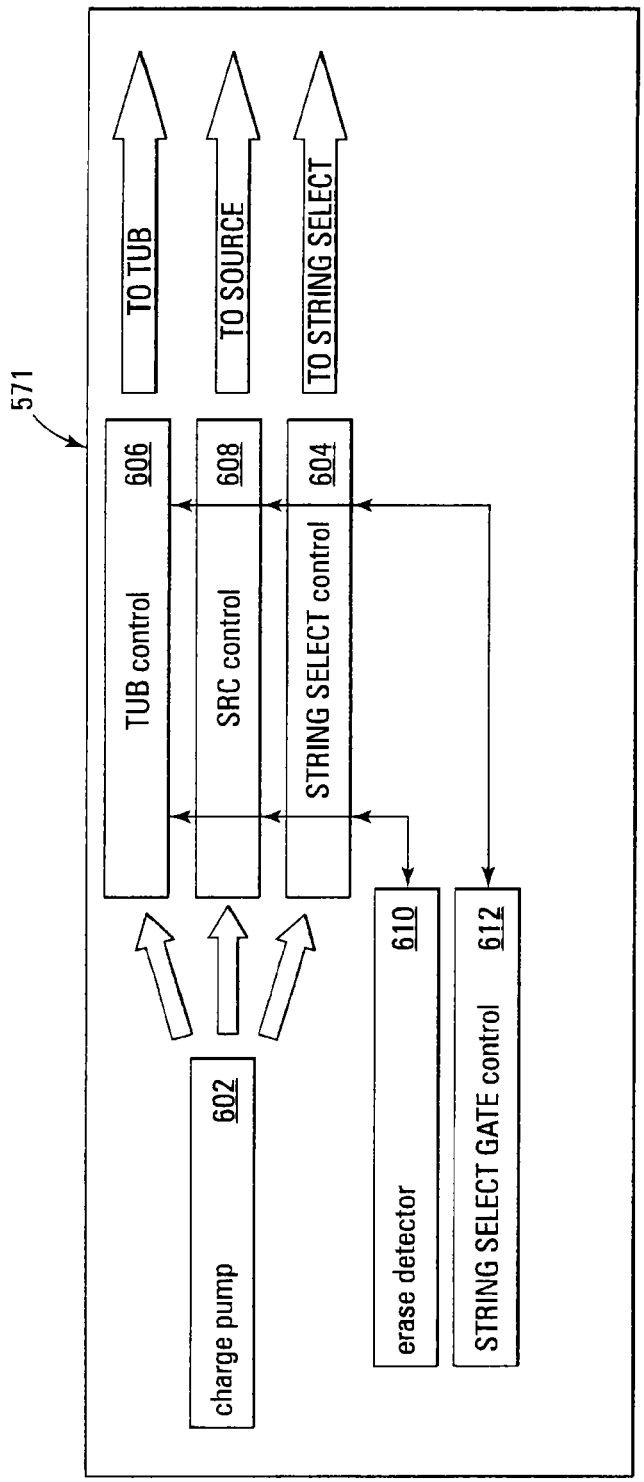
FIG. 6 is a functional block diagram of an erase control circuit according to another embodiment of the present disclosure.

In one example embodiment, shown in block diagram in FIG. 6, an erase control circuit such as circuit 571 includes a charge pump 602 that can pump to the erase voltage, and which is selectively connected to string select control 604, tub control 606, and source control 608. Tub control 606 and source control 608 are each also selectively connected to Vss to allow discharging the same. In addition to being selectively connected to the tub and/or the source, string select control is selectively connected to Vcc and to Vss to allow charging to Vcc and discharging to Vss. An erase detector 610 determines when discharging of the tub and/or source have reached the intermediate voltage as discussed above. String select gate control 612 controls connection of the tub and/or source to the gates of the string select gates. It should be understood that design and implementation of this circuitry is well within the skill of those in the art, and its operation is detailed with respect to the various methods described herein, and as such it will not be further discussed.

CONCLUSION

Erase methods and memories using those erase methods have been shown that include maintaining low voltage transistors in a turned on state during discharge following memory erase, such as to prevent break down of the transistors and trapping of voltage on bit lines.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of erasing in a memory, comprising:
   erasing a block of memory cells with an erase voltage; and
   protecting string select gate transistors from break down while discharging data lines, coupled to the string select gate transistors, from the erase voltage.

2. The method of claim 1, wherein protecting comprises:
   keeping the string select gate transistors in a turned on state while discharging the data lines, coupled to the string select gate transistors, from the erase voltage.

3. A method of erasing in a memory, comprising:
   erasing a block of memory cells with an erase voltage; and
   protecting string select gate transistors from break down during discharge of the erase voltage;
   wherein protecting comprises keeping the string select gate transistors in a turned on state during discharge of the erase voltage; and
   wherein keeping the string select gate transistors in a turned on state during discharge of the erase voltage further comprises maintaining gates of the string select gate transistors at least a turn-on voltage above a voltage of a tub and source of the string select gate transistors until the tub and source are discharged to a reference voltage.

4. A method of erasing in a memory, comprising:
   erasing a block of memory cells with an erase voltage; and
   protecting string select gate transistors from break down during discharge of the erase voltage;
   wherein protecting comprises keeping the string select gate transistors in a turned on state during discharge of the erase voltage; and
   wherein data lines of the memory are fully discharged while the string select gate transistors are in a turned on state.

5. A method of erasing in a memory, comprising:
   erasing a block of memory cells with an erase voltage; and
   protecting string select gate transistors from break down during discharge of the erase voltage; and
   biasing gates of the string select gate transistors to a supply voltage once voltages of a tub and source of the string select gate transistors are discharged to a reference voltage;
   wherein protecting comprises keeping the string select gate transistors in a turned on state during discharge of the erase voltage.

6. A method of erasing in a memory, comprising:
   erasing a block of memory cells with an erase voltage; and
   protecting string select gate transistors from break down during discharge of the erase voltage;
   wherein protecting string select gate transistors of the memory during discharge of the erase voltage comprises:
      charging a tub and source of the string select gate transistors to an erase voltage;
      discharging the tub and source to an intermediate voltage below the erase voltage;
      floating at least one of the tub and the source when the tub reaches the intermediate voltage;
      disconnecting the string select gate transistors from the tub and source;
      discharging bit lines of the memory to the intermediate voltage; and
      discharging the tub and source from the intermediate voltage to a reference voltage.

7. The method of claim 6, wherein the intermediate voltage is at least a turn-on voltage of the string select gate transistors below the erase voltage.

8. A method of erasing in a memory, comprising:
   erasing a block of memory with an erase voltage; and
   protecting string select gate transistors of the memory while discharging data lines, coupled to the string select gate transistors, from the erase voltage.

9. A method of erasing in a memory, comprising:
   erasing a block of memory with an erase voltage; and
   protecting string select gate transistors of the memory during discharge of the erase voltage;
   wherein protecting further comprises turning the string select gate transistors on after partial discharge of the erase voltage, wherein the string select gate transistors are operated in a turned-on state throughout discharge of the erase voltage.

10. The method of claim 9, wherein gates of the string select gate transistors are discharged from the erase voltage via a coupling effect to a tub and/or source of the string select gate transistors.

11. The method of claim 9, wherein turning the string select gate transistors on after partial discharge of the erase voltage further comprises:
    discharging tub, source, and gates of the string select gate transistors below the erase voltage; and
    re-charging the gates of the string select gate transistors to the erase voltage, wherein the gates of the string select gate transistors are discharged through a coupling effect with the tub while the tub is discharged.

12. A method of erasing in a memory, comprising:
    erasing a block of memory with an erase voltage; and
    protecting string select gate transistors of the memory during discharge of the erase voltage;
    wherein protecting string select gate transistors of the memory during discharge of the erase voltage further comprises:
       discharging a tub and a source of the string select gate transistors from an erase voltage to an intermediate voltage at least a turn-on voltage of the string select gate transistors lower than the erase voltage;
       recharging gates of the string select gate transistors to the erase voltage; and
       discharging the tub and source from the intermediate voltage to a reference voltage.

13. A method of erasing in a memory, comprising:
    erasing a block of memory with an erase voltage; and
    protecting string select gate transistors of the memory during discharge of the erase voltage;
    wherein protecting string select gate transistors of the memory during discharge of the erase voltage comprises:
       charging a tub and source of the string select gate transistors to the erase voltage;
       discharging the tub and source to an intermediate voltage below the erase voltage;
       floating at least one of the tub and the source when the tub reaches the intermediate voltage;
       disconnecting the string select gate transistors from the tub and source;
       discharging bit lines of the memory to the intermediate voltage; and
       discharging the tub and source from the intermediate voltage to a reference voltage.

14. The method of claim 13, wherein the intermediate voltage is at least a turn-on voltage of the string select gate transistors below the erase voltage.

15. A memory device, comprising:
an array of memory cells; and
a controller for control and/or access of the array of memory cells, the controller configured to:
 erase a block of memory cells with an erase voltage; and
 protect string select gate transistors from break down while discharging data lines, coupled to the string select gate transistors, from the erase voltage.

16. A memory device, comprising:
an array of memory cells; and
a controller for control and/or access of the array of memory cells, the controller configured to:
 erase a block of memory cells with an erase voltage; and
 protect string select gate transistors from break down during discharge of the erase voltage;
wherein the controller is further configured to monitor a tub voltage and/or a source voltage, disconnect the tub and source from gates of the string select gate transistors and a reference voltage when the tub voltage reaches an intermediate voltage, recharge the gates of the string select gate transistors, allow the gates of the string select gate transistors to float, and reconnect the tub and the source to the reference voltage when the gates of of string select gate transistors are recharged.

17. A memory device, comprising:
an array of memory cells; and
a controller for control and/or access of the array of memory cells, the controller configured to:
 erase a block of memory cells with an erase voltage; and
 protect string select gate transistors from break down during discharge of the erase voltage;
wherein the controller maintains the string select gate transistors in a conductive state of operation while a tub and a source are discharged from an intermediate voltage to a reference voltage.

18. A memory device, comprising:
an array of memory cells; and
a controller for control and/or access of the array of memory cells, the controller configured to:
 erase a block of memory cells with an erase voltage; and
 protect string select gate transistors from break down during discharge of the erase voltage;
wherein controller maintains gates of the string select gate transistors at a voltage difference above a tub and source voltage while the tub and source are discharged from an intermediate voltage to a reference voltage.

19. A memory device, comprising:
an array of non-volatile memory cells logically arranged in rows and columns and accessed by data lines and access lines; and
circuitry for control and/or access of the array of non-volatile memory cells, the control circuitry configured to perform a method comprising:
 erasing a block of memory with an erase voltage; and
 protecting string select gate transistors of the memory while discharging the data lines from the erase voltage.

20. A memory device, comprising:
an array of non-volatile memory cells logically arranged in rows and columns and accessed by data lines and access lines; and
circuitry for control and/or access of the array of non-volatile memory cells, the control circuitry configured to perform a method comprising:
 erasing a block of memory with an erase voltage; and
 protecting string select gate transistors of the memory during discharge of the erase voltage;
wherein the control circuitry is further configured to monitor a tub voltage and/or a source voltage, disconnect the tub and source from gates of the string select gate transistors and a reference voltage when the tub voltage reaches an intermediate voltage, recharge the gates of the string select gate transistors, allow the gates of the string select gate transistors to float, and reconnect the tub and the source to the reference voltage when the gates of the string select gate transistors are recharged.

21. A memory device, comprising:
an array of non-volatile memory cells logically arranged in rows and columns and accessed by data lines and access lines; and
circuitry for control and/or access of the array of non-volatile memory cells, the control circuitry configured to perform a method comprising:
 erasing a block of memory with an erase voltage; and
 protecting string select gate transistors of the memory during discharge of the erase voltage;
wherein the control circuitry is further configured to maintain the string select gate transistors in a conductive state of operation while a tub and a source are discharged from an intermediate voltage to a reference voltage.

* * * * *

UNITED STATES PATENT AND TRADEMARK OFFICE
CERTIFICATE OF CORRECTION

PATENT NO. : 8,462,559 B2
APPLICATION NO. : 13/331185
DATED : June 11, 2013
INVENTOR(S) : Shigekazu Yamada et al.

It is certified that error appears in the above-identified patent and that said Letters Patent is hereby corrected as shown below:

In the Claims

In column 9, line 23, in Claim 16, delete "of of" and insert -- of --, therefor.

Signed and Sealed this
Seventeenth Day of September, 2013

Teresa Stanek Rea
*Deputy Director of the United States Patent and Trademark Office*